United States Patent
Zaczek et al.

(10) Patent No.: US 12,117,731 B2
(45) Date of Patent: Oct. 15, 2024

(54) METHOD FOR PRODUCING A MIRROR OF A MICROLITHOGRAPHIC PROJECTION EXPOSURE APPARATUS

(71) Applicant: Carl Zeiss SMT GmbH, Oberkochen (DE)

(72) Inventors: Christoph Zaczek, Heubach (DE); Erik Loopstra, Ederheim Huernheim (DE); Eric Eva, Aalen (DE); Drew Chieda, Wilton, CT (US); Matthew Lipson, Wilton, CT (US); Victor Perez-Falcon, Wilton, CT (US); Moshe Shemesh, Wilton, CT (US)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 18/080,109

(22) Filed: Dec. 13, 2022

(65) Prior Publication Data

US 2024/0192605 A1    Jun. 13, 2024

(51) Int. Cl.
*G03F 7/00* (2006.01)

(52) U.S. Cl.
CPC .......... *G03F 7/702* (2013.01); *G03F 7/70891* (2013.01); *G03F 7/7095* (2013.01); *G03F 7/70975* (2013.01)

(58) Field of Classification Search
CPC ................... G03F 7/70; G03F 7/70058; G03F 7/7015–70191; G03F 7/702;

(Continued)

(56) References Cited

U.S. PATENT DOCUMENTS 6,573,978 B1   6/2003 McGuire, Jr.
10,427,974 B2 * 10/2019 Annamalai ............ B32B 17/06
(Continued)

FOREIGN PATENT DOCUMENTS

DE   102008009600 A1   8/2009
DE   102017220586 A1   5/2019
(Continued)

OTHER PUBLICATIONS

English translation of WO2023/036568, published Mar. 16, 2023. (Year: 2023).*

(Continued)

*Primary Examiner* — Christina A Riddle
(74) *Attorney, Agent, or Firm* — Edell, Shapiro & Finnan, LLC

(57) ABSTRACT

This disclosure relates to a method for producing a mirror of a microlithographic projection exposure apparatus, a first mirror part and a second mirror part being provided, which are in contact in the region of a first connecting surface of the first mirror part and a second connecting surface of the second mirror part. For forming a durable connection between the first mirror part and the second mirror part, the first mirror part and the second mirror part are heated up to a holding temperature of at least 400° C. and are kept at the holding temperature during a holding time. After the holding time has elapsed, the first mirror part and the second mirror part are cooled down to a first cooling temperature at a first cooling rate of less than or equal to 100 K/h.

17 Claims, 4 Drawing Sheets

(58) Field of Classification Search
CPC ............. G03F 7/70208; G03F 7/70216; G03F 7/70233; G03F 7/70308; G03F 7/70316; G03F 7/70958; G03F 7/70483–70504; G03F 7/70591; G03F 7/706; G03F 7/708; G03F 7/70808; G03F 7/70825; G03F 7/70833; G03F 7/70841; G03F 7/70858; G03F 7/70883; G03F 7/70891; G03F 7/7095; G03F 7/70975; G03F 7/70983; G03F 7/70991; G03F 7/7085; G03F 7/70875; G03F 7/70225; C03B 23/20–26; C03B 19/1453; C03B 32/00–02; C03B 25/00–12
USPC .... 355/18, 30, 52–55, 67–77; 359/838–884; 156/89.11, 99–107, 282, 311, 349, 380.9; 264/1.1–2.7; 250/492.1–492.3, 493.1, 250/503.1, 504 R
See application file for complete search history.

(56) References Cited

U.S. PATENT DOCUMENTS

| | | | |
|---|---|---|---|
| 11,169,445 B2 | 11/2021 | Bieling et al. | |
| 2004/0107731 A1* | 6/2004 | Doehring | C03B 19/02 65/374.13 |
| 2006/0132747 A1 | 6/2006 | Singer et al. | |
| 2009/0122428 A1* | 5/2009 | Phillips | G02B 7/181 359/846 |
| 2011/0207592 A1 | 8/2011 | Duran et al. | |
| 2012/0183719 A1* | 7/2012 | Kuehn | C03B 23/20 65/33.5 |
| 2013/0107239 A1 | 5/2013 | Clauss | |
| 2013/0120863 A1* | 5/2013 | Kaller | C03B 19/06 359/838 |
| 2014/0300876 A1* | 10/2014 | Baer | G03F 7/706 359/359 |
| 2016/0320715 A1* | 11/2016 | Becker | G02B 7/008 |
| 2018/0074303 A1 | 3/2018 | Schwab | |
| 2021/0157244 A1* | 5/2021 | Kaes | G03F 7/702 |

FOREIGN PATENT DOCUMENTS

| | | |
|---|---|---|
| DE | 102020208648 A1 | 1/2022 |
| DE | 102021203475 A1 | 10/2022 |
| EP | 1614008 B1 | 12/2009 |
| WO | 2022008155 A1 | 1/2022 |
| WO | 2022214290 A1 | 10/2022 |
| WO | WO-2023036568 A1 * | 3/2023 |

OTHER PUBLICATIONS

International Search Report and the Written Opinion, PCT/EP2023/051684, Aug. 11, 2023, 16 pages.

* cited by examiner

METHOD FOR PRODUCING A MIRROR OF A MICROLITHOGRAPHIC PROJECTION EXPOSURE APPARATUS

FIELD

The techniques disclosed herein relate to a method for producing a mirror of a microlithographic projection exposure apparatus. The techniques also relate to a mirror of a microlithographic projection exposure apparatus, to an illumination optical unit, to a projection optical unit and to a microlithographic projection exposure apparatus.

BACKGROUND

Microlithographic projection exposure apparatuses are used in the production of semiconductors and generally have an illumination optical unit and a projection optical unit. The illumination optical unit generates, from the light of a light source, a desired light distribution for the illumination of a reticle, which is often also referred to as a mask. Light should be understood in this case in the general sense of electromagnetic radiation, i.e., there is no restriction to a specific wavelength. Accordingly, hereafter the terms "light" and "radiation" are used synonymously, i.e., a light source may also be referred to as a radiation source, a light distribution may also be referred to as a radiation distribution and so on. With the projection optical unit, the reticle is imaged onto a light-sensitive material, which is, for example, applied to a wafer or some other substrate, such as a semiconductor material. In this way, the light-sensitive material is exposed in a structured manner to a pattern predefined by the reticle. Since the reticle has tiny structural elements, which are intended to be transferred to the substrate with high precision, the illumination optical unit generates a desired light distribution precisely and reproducibly such that the imaging by the projection optical unit takes place precisely and reproducibly.

In addition to further optical elements, the light path through the illumination optical unit and the projection optical unit may have at least one mirror, which deflects the light in a predefined way by reflection at its optical surface. How the light deflection specifically takes place depends on the formation of the optical surface, in particular on its form. The optical surface may, for example, be formed as a metallic layer or as a series of layers with alternating refractive indices. Irrespective of the formation of the optical surface, it is impossible to achieve a perfect reflection, and so part of the light is always absorbed and causes a heating up of the mirror. The heating up is in turn accompanied by a thermal expansion and, as a consequence, a deformation of the mirror and, in particular, of the optical surface. This deformation may ultimately cause the optical properties of the mirror to change.

In order to minimize or lessen the effects of the heating up of the mirror on its optical properties, the mirror may be produced from a material with an extremely low coefficient of thermal expansion. Such materials may have a zero crossing temperature, in the direct vicinity of which the thermal expansion is particularly low and ideally even zero. When using such materials, it is therefore generally endeavored to operate the mirror at its zero crossing temperature or in the direct vicinity of its zero crossing temperature. This in turn has the effect that the zero crossing temperature should correspond as closely as possible to the temperature that the mirror assumes under the intended operating conditions or should lie somewhat above this temperature. A zero crossing temperature somewhat above the expected operating temperature of the mirror has the advantage that instances of local heating up of the mirror due to maxima of the light intensity lead to very little expansion of the mirror.

It is known from U.S. Ser. No. 10/427,974B2 to influence the coefficient of thermal expansion and its increase with respect to the temperature of doped quartz glass by a heat treatment.

It may be advantageous or even necessary to form the mirror from more than one part, for example if the mirror is intended to have cooling channels or if the mirror is intended to be larger than the material blanks available for the production of the mirror.

A multipart mirror with cooling channels is known from DE 102020208648.6.

A problem with mirrors that are formed from more than one part is how to connect the individual parts of the mirror in a way that meets the high requirements for lithographic optical parts.

SUMMARY

The techniques disclosed herein are based on the object of forming a multipart mirror of a microlithographic projection exposure apparatus such that it meets very high optical requirements and has great dimensional stability under the intended operating conditions. In particular, the mirror is intended to undergo very little thermally induced deformation under the intended operating conditions.

This object may be achieved by the combination of features that may be incorporated into one or more methods as described herein.

In the case of a method for producing a mirror of a microlithographic projection exposure apparatus, a first mirror part and a second mirror part are provided, which are in contact in the region of a first connecting surface of the first mirror part and a second connecting surface of the second mirror part. For forming a durable connection between the first mirror part and the second mirror part, the first mirror part and the second mirror part are heated up to a holding temperature of at least 400° C. and are kept at the holding temperature during a holding time. After the holding time has elapsed, the first mirror part and the second mirror part are cooled down to a first cooling temperature at a first cooling rate that is less than or equal to 100 K/h.

The method may have the advantage that it allows a very durable connection to be formed between the mirror parts. The process of forming this connection is also referred to hereafter as bonding. A further advantage of the method is that the multipart mirror produced may meet the very high optical requirements for microlithographic exposure apparatuses and the multipart mirrors may be formed with great dimensional stability under the intended operating conditions. In particular, the mirror may be formed such that it undergoes very little thermally induced deformation under the intended operating conditions. This may be achieved by the mirror being formed with a zero crossing temperature that is averaged over a relevant volume and deviates very little from a predefined value and/or being formed with a zero crossing temperature that has little spatial variation within this relevant volume, and is consequently very homogeneous. Particularly relevant here are regions of the volume of the mirror that are arranged at such a small distance from its optical surface that they can make it deform to an inadmissible extent.

An important finding of the disclosed techniques is that the heat treatment used for connecting the mirror parts can have an influence on the zero crossing temperature of the mirror that should be taken into account when devising the heat treatment, in order to produce particularly high-quality mirrors. In other words, the zero crossing temperature of the material from which the mirror parts are produced and which has been set with extremely great effort to a desired value can be changed by the bonding. For this reason, within the method of the disclosed techniques, for example, a relatively low cooling rate is chosen, which allows the heat treatment process to be precisely monitored at any time and as far as possible in the entire volume of the mirror parts.

A low cooling rate has the advantage that, for example, when there is a variation of the cooling rate, the temperature differences in different regions of the volume of the mirror parts are comparatively small. This in turn has the consequence of comparatively small inhomogeneities of the zero crossing temperature of the mirror. A further advantage is that temperature errors of the oven in which the mirror parts are kept at a temperature or of the mirror parts themselves do not have such a strong effect on the homogeneity of the zero crossing temperature. A low cooling rate generally has a greater effect on the absolute value of the zero crossing temperature than a high cooling rate. However, this can be taken into account in the production of the material for the mirror parts.

The heat treatment may be carried out in air or in an inert gas atmosphere. It is also possible to carry out the heat treatment under vacuum conditions.

The first mirror part and the second mirror part may be provided in the form of an intermediate product that is produced by wringing the first connecting surface of the first mirror part and the second connecting surface of the second mirror part. This makes it easier to carry out the heat treatment, since the mirror parts do not have to be handled individually and the mirror parts do not need to be positioned relative to each other during the heat treatment as they will have already been joined by the wringing process. Furthermore, there is a good chance of the bonding being successful if the wringing has previously succeeded. This is because the connecting surfaces of the mirror parts must be brought very close together during bonding and the connecting surfaces have to meet similar preconditions for the bonding as for the wringing. Furthermore, there is the possibility of investigating the intermediate product for possible defects before the heat treatment. The defects may be, for example, inclusions between the connecting surfaces. If defects are discovered, the intermediate product may be rejected or subjected to some other treatment. As a result, the elaborate heat treatment can be avoided for defective intermediate products.

During the wringing, the first mirror part and the second mirror part may be brought together such that a partial region of the first connecting surface and a partial region of the second connecting surface come into contact and form a common contact surface first, and the contact surface is then increased in size by continuing to bring the first mirror part and the second mirror part together in a rolling direction.

The transitional zone between the common contact surface, within which the second mirror part has already been wrung onto the first mirror part, and the non-wrung region of the first and second connecting surfaces is also referred to as the wringing front. Continuing to bring the first mirror part and the second mirror part together has the effect that the wringing front advances in a monitored manner in the rolling direction. This successive wringing has the advantage that the relative alignment of the two mirror parts in relation to one another can be precisely monitored during the entire wringing operation and undesired spontaneous wringing can be avoided. Furthermore, at any time in the wringing operation there is a fluidic connection between the region of the wringing front and the surrounding area, and so an escape of gas from this region is ensured at any time, largely preventing and gas inclusions between the connecting surfaces.

The first mirror part and the second part may be brought together such that contact with the first mirror part first occurs in a region of the second surface that adjoins the outer contour of the second mirror part. It is similarly possible to bring the first mirror part and the second mirror part together such that contact with the first mirror part first occurs in the region of the center of the second connecting surface. This allows the way in which the wringing operation is carried out to be made to suit the respective circumstances, in particular the formation of the second mirror part.

On a side of the second mirror part that is facing away from the second connecting surface, a region for formation of an optical surface may be provided.

The first connecting surface of the first mirror part and/or the second connecting surface of the second mirror part may have a curvature. A curved first connecting surface and/or second connecting surface may be advantageous, particularly when a curved optical surface is to be formed on the second mirror part. For example, a curved first connecting surface and/or a curved second connecting surface may allow for a constant thickness of the second mirror part, and therefore a uniform deformability of the second mirror part. Furthermore, a constant distance between the cooling channels and the optical surface may then be created with little effort. The curvature of the first connecting surface and/or the second connecting surface may correspond to the curvature of the intended optical surface of the mirror.

It is also possible to provide a first connecting surface which is formed in a planar manner or has a large average radius of curvature, in particular an average radius of curvature of more than 10 m, along at least one direction. Then a thin second mirror part can be used, in particular a second mirror part with a thickness of 0.5 mm to 10 mm, which has a second connecting surface formed in a planar manner. If the second mirror part has cooling channels, the thickness is determined from the bottom of the cooling channels. Such a thin second mirror part has the advantage that its second connecting surface can be deformed and, as a result, adapted to the form of the first connecting surface of the first mirror part. Accordingly, there may be no need to produce a second mirror part with a curved second connecting surface.

With respect to mirrors configured to reflect radiation with a wavelength $\lambda$ of 633 nm, the form of the first connecting surface of the first mirror part and/or the second connecting surface of the second mirror part may deviate from a predefined form by less than $\lambda/2$, preferably less than $\lambda/10$. The first connecting surface of the first mirror part and/or the second connecting surface of the second mirror part may have a roughness of less than 5 nm, preferably less than 1 nm. The term "roughness" in this case subsumes the randomly distributed deviations from a smooth surface. Precisely formed and smoothed connecting surfaces make wringing and bonding easier, reduce the risk of gas inclusions and increase the load-bearing capacity of the connection. Before the wringing or bonding, one of the two connecting surfaces may be adapted to the actual form of the other of the two connecting surfaces. In this way, the precision can be increased still further.

There is the possibility that the curvature of the first connecting surface is formed convexly, and the curvature of the second connecting surface is formed concavely or the curvature of the first connecting surface is formed concavely and the curvature of the second connecting surface is formed convexly. While the first mirror part and the second mirror part are being brought together, the convex curvature has an average radius of curvature of which the absolute amount is less than the absolute amount of the average radius of curvature of the concave curvature. The use of such surfaces has the advantage that a locally sequential wringing can be ensured because the distance between the two connecting surfaces increases with increasing distance from the wringing front. The risk of undesired wringing at a distance from the wringing front is reduced. Furthermore, the risk of gas inclusions is reduced.

Before being heated up to the holding temperature, the intermediate product may be stored for a storage time of at least 2 hours, preferably at least 12 hours, particularly preferably at least 24 hours, at a storage temperature which is at least 80° C. and at most 400° C. Preferably, the storage temperature is at least 160° C., and particularly preferably at least 250° C. Furthermore, the storage temperature is preferably at most 350° C. Storage at these temperatures has the advantage that excess moisture diffuses out from the region of the connecting surfaces of the mirror parts and the strength increases. In particular, an anhydrous material is conducive to the formation of covalent bonds during the subsequent heat treatment at the holding temperature. If comparatively low values in the range from, for example, 400° C. to 550° C. are chosen for the holding temperature, the storage takes place for a long period of time at low storage temperatures, for example one to two weeks at a holding temperature of less than or equal to 250° C.

According to specific examples of the disclosed techniques, the first mirror part and the second mirror part are heated up to a holding temperature of at least 500° C., preferably at least 600° C., and particularly preferably at least 700° C. With the aid of a high holding temperature, a particularly durable connection of the mirror parts can be achieved because a particularly high number of covalent bonds may be formed.

The first mirror part and the second mirror part may be heated up to a holding temperature of less than or equal to 900° C. In addition to the advantages already discussed, high holding temperatures may be accompanied by the disadvantage that the influence of the heat treatment on the zero crossing temperature increases. Using the above-described holding temperature range, a good compromise may be achieved.

The first mirror part and the second mirror part may be heated up to the holding temperature at a heating rate of less than or equal to 150 K/h, and preferably less than or equal to 100 K/h. Slow heating up has the advantage that fewer stresses form between inner and outer regions of the mirror parts and more time is available for the outward diffusion of water.

The holding time may be at least 8 hours, preferably at least 12 hours, and particularly preferably at least 20 hours. A long holding time has the advantage that the connection between the mirror parts has a greater tensile strength because more covalent bonds may be formed. To make efficient production possible, the holding time is preferably less than or equal to 72 hours, and particularly preferably less than or equal to 48 hours.

The first cooling temperature may be 700° C. or less. In particular, the first cooling temperature may be 600° C. or less. The first cooling rate is preferably 50 K/h or less. In particular, the first cooling rate is between 1 K/h and 20 K/h. Lower cooling rates have the advantage that the first mirror part and the second mirror part cool down relatively uniformly over the entire volume. High spatial temperature gradients are avoided and the variations in temperature over time are similar in the entire volume. This in turn leads to a relatively homogeneous distribution of the zero crossing temperature in the mirror.

After the cooling at the first cooling rate to the first cooling temperature, the first mirror part and the second mirror part may be cooled at a second cooling rate, which is greater than the first cooling rate, to a second cooling temperature, which is less than the first cooling temperature. The second cooling temperature may be 500° C. or less, and preferably 400° C. or less. The second cooling rate may be 150 K/h or less. In particular, the second cooling rate may lie between 5 K/h and 100 K/h. After the cooling to the second cooling temperature, the first mirror part and the second mirror part may be cooled down further toward room temperature. The further cooling may take place at a third cooling rate, which at least initially is greater than the second cooling rate. The use of greater cooling rates at low cooling temperatures allows the heat treatment to be speeded up considerably without appreciable losses in quality of the mirror, since with low cooling temperatures the influence of the cooling profile on the zero crossing temperature of the mirror is significantly lower than with high cooling temperatures.

The first mirror part and the second mirror part may be cooled such that a sliding average value of the cooling rate, formed over a temperature interval of 20 K, has an identical relative variation over time in a temperature range from 900° C. to 700° C., except for a deviation of less than or equal to 2 K/h, in the entire volume of the first mirror part and/or the second mirror part. This means that the cooling can take place such that, after allowing for a respective potentially existing time difference, the variations over time of this sliding average value at all locations of the first mirror part and/or the second mirror part differ by less than or equal to 2 K/h. Preferably, the deviation of the sliding average value in the temperature range from 900° C. to 700° C. is less than or equal to 1 K/h. Furthermore, it may be provided that the deviation of the sliding average value in the temperature range from 700° C. to 500° C. is less than or equal to 4 K/h, and preferably less than or equal to 2 K/h. With the aid of this specification, consistently high quality mirrors may be produced. In this case, the heat treatment can in turn be speeded up without any great adverse effects by the somewhat greater tolerance at low temperatures. Furthermore, the first mirror part and the second mirror part may be cooled such that an inhomogeneity of the zero crossing temperature of the mirror attributable to the heat treatment is less than or equal to +/−1 K, and preferably less than or equal to +/−0.5 K. These tolerances should be maintained in particular within a volume zone of the mirror that overlaps laterally with its optical surface and extends in depth from the optical surface to the cooling channels, i.e., from the optical surface to the beginning of the cooling channels. It is also possible that these tolerances are maintained within a volume zone of the mirror that overlaps laterally with its optical surface and extends in depth from the optical surface to 1 cm below the cooling channels.

The first cooling rate and/or the second cooling rate may be chosen based on the material composition of the first mirror part and/or the second mirror part. In particular, the first cooling rate and/or the second cooling rate are chosen based on the OH content and/or on the titanium content of the first mirror part and/or the second mirror part. Since the influence of heat treatment on the zero crossing temperature of the mirror depends on the material composition of the mirror parts, the achievable precision with respect to the properties of the mirror, in particular with respect to its zero crossing temperature, can be improved by taking the material composition into account when devising the heat treatment.

The first cooling rate and/or the second cooling rate may be chosen based on a desired average zero crossing temperature of the mirror. This makes it possible to produce mirrors with a very small deviation of the average zero crossing temperature from a predefined value. In particular, the first cooling rate and/or the second cooling rate may be chosen based on a desired average zero crossing temperature within a volume zone of the mirror that overlaps laterally with its optical surface and extends in depth from the optical surface to the cooling channels or to 1 cm below the cooling channels.

To determine the first cooling rate and/or the second cooling rate, a material sample of the material from which the first mirror part and/or the second mirror part has been produced may be analyzed. It may be provided, in particular, that the material sample undergoes all of the heat treatments of the material of the first mirror part and/or the second mirror part in a substantially identical way. In this way, it is possible for the first cooling rate and/or the second cooling rate to be adjusted very precisely to suit the material composition of the first mirror part and/or the second mirror part without risk of damage to the mirror parts, and so very high precision and low variance with respect to the average zero crossing temperature of the mirrors produced can be achieved.

The disclosed techniques also relate to a mirror of a microlithographic projection exposure apparatus, which has a first mirror part, a second mirror part and an optical surface for the reflection of light. The first mirror part and the second mirror part are durably connected to one another in the region of a first connecting surface of the first mirror part and a second connecting surface of the second mirror part by a heat treatment. The mirror has, within a volume zone that overlaps laterally with the optical surface and extends in depth from the optical surface to 1 cm, an average zero crossing temperature that deviates from a predefined value by less than or equal to +/−1 K. In this volume zone, the predefined value may decrease with increasing distance from the optical surface.

Such a precise average zero crossing temperature may be achieved in spite of the influence of the heat treatment on the zero crossing temperature by the first mirror part and the second mirror part being connected to one another with the aid of the methods disclosed herein. Preferably, the average zero crossing temperature deviates from the predefined value by less than or equal to +/−0.5 K, and particularly preferably by less than or equal to +/−0.2 K.

Ignoring the influence on the zero crossing temperature of the mirror of the heat treatment with the aid of which the mirror parts are connected to one another, which is taken into account in the methods disclosed herein, it is scarcely possible to achieve such high accuracies.

The first connecting surface of the first mirror part and/or the second connecting surface of the second mirror part may have a curvature. The curvature of the first connecting surface of the first mirror part may be formed without rotational symmetry, and so the first connecting surface may have different average radii of curvature, and/or the curvature of the second connecting surface of the second mirror part may be formed without rotational symmetry, and so it has different average radii of curvature.

Cooling channels may be formed in the first mirror part and/or in the second mirror part. In this case, the mirror may have within a volume zone that overlaps laterally with its optical surface and extends in depth from the optical surface to the cooling channels, i.e., from the optical surface to the beginning of the cooling channels, an average zero crossing temperature that deviates from a predefined value by less than or equal to +/−1 K, preferably by less than or equal to +/−0.5 K, and particularly preferably by less than or equal to +/−0.2 K. If the mirror has cooling channels, this condition may take the place of the previously mentioned condition, which independently of any cooling channels relates to a volume zone from the optical surface to a depth of 1 cm, and so the volume zone in the case of a mirror with cooling channels can extend to a depth of less than 1 cm. It is similarly also possible that the mirror has within a volume zone that overlaps laterally with its optical surface and extends in depth from the optical surface to 1 cm below the cooling channels an average zero crossing temperature that deviates from a predefined value by less than or equal to +/−1 K, preferably by less than or equal to +/−0.5 K, and particularly preferably by less than or equal to +/−0.2 K. In the volume zones mentioned, the predefined value may in each case decrease with increasing distance from the optical surface. The cooling channels may be formed as open toward the first connecting surface of the first mirror part and/or toward the second connecting surface of the second mirror part.

The cooling channels may be arranged in each case with the greatest part of their longitudinal extent laterally within the region intended for the optical surface. This makes possible efficient cooling of the region that has a particularly great influence on a temperature-induced deformation of the optical surface.

Furthermore, the cooling channels may run parallel to the optical surface. This makes particularly uniform cooling of the optical surface possible. In particular, the cooling channels may reach up to the optical surface to within a distance of 1 to 6 mm. The form deviation between the second connecting surface of the second mirror part and the optical surface may be less than or equal to 3 mm, and preferably less than or equal to 20 µm.

In a refinement, the clear distance between adjacent cooling channels is less than or equal to 15 mm, and preferably less than or equal to 5 mm. Small distances between the cooling channels make efficient and uniform cooling possible and can facilitate the deformability of the second mirror part during the wringing, and in particular in the case of a rolling direction transverse to the cooling channels of the second mirror part. In particular, the values for the width of the cooling channels, for the clear distance between adjacent cooling channels and for the distance between the cooling channels and the optical surface may be approximately the same.

The transverse dimensions of the cooling channels may be 0.2 to 10 mm. The depth of the cooling channels, i.e., the transverse dimension approximately perpendicular to the first connecting surface of the first mirror part or to the second connecting surface of the second mirror part, may be greater than the width of the cooling channels, i.e., the transverse dimension perpendicular to the depth. In particular, the depth of the cooling channels may be more than twice the width of the cooling channels. As a result, with the same flow cross section, there is a smaller risk of a deformation of the optical surface of the mirror due to the pressure of the fluid in the cooling channels, because the proportion of the surface area of the cavities formed by the cooling channels parallel to the optical surface area is smaller than in the case of wide cooling channels that have a small depth.

The first mirror part may have a greater thickness than the second mirror part. This makes efficient cooling of the optical surface possible, and at the same time a great mechanical stability of the mirror.

The disclosed techniques also relate to an illumination optical unit with a mirror formed according to the disclosed techniques and/or produced by the disclosed methods.

The disclosed techniques also relate to a projection optical unit with a mirror formed according to the disclosed techniques and/or produced by the disclosed methods.

Finally, the disclosed techniques relate to a microlithographic projection exposure apparatus with an illumination optical unit according to the disclosed techniques and/or a projection optical unit according the disclosed techniques.

BRIEF DESCRIPTION OF THE DRAWINGS

Exemplary embodiments of the disclosed techniques are explained in more detail below with reference to the drawings, in which.

DETAILED DESCRIPTION

Figure 1:
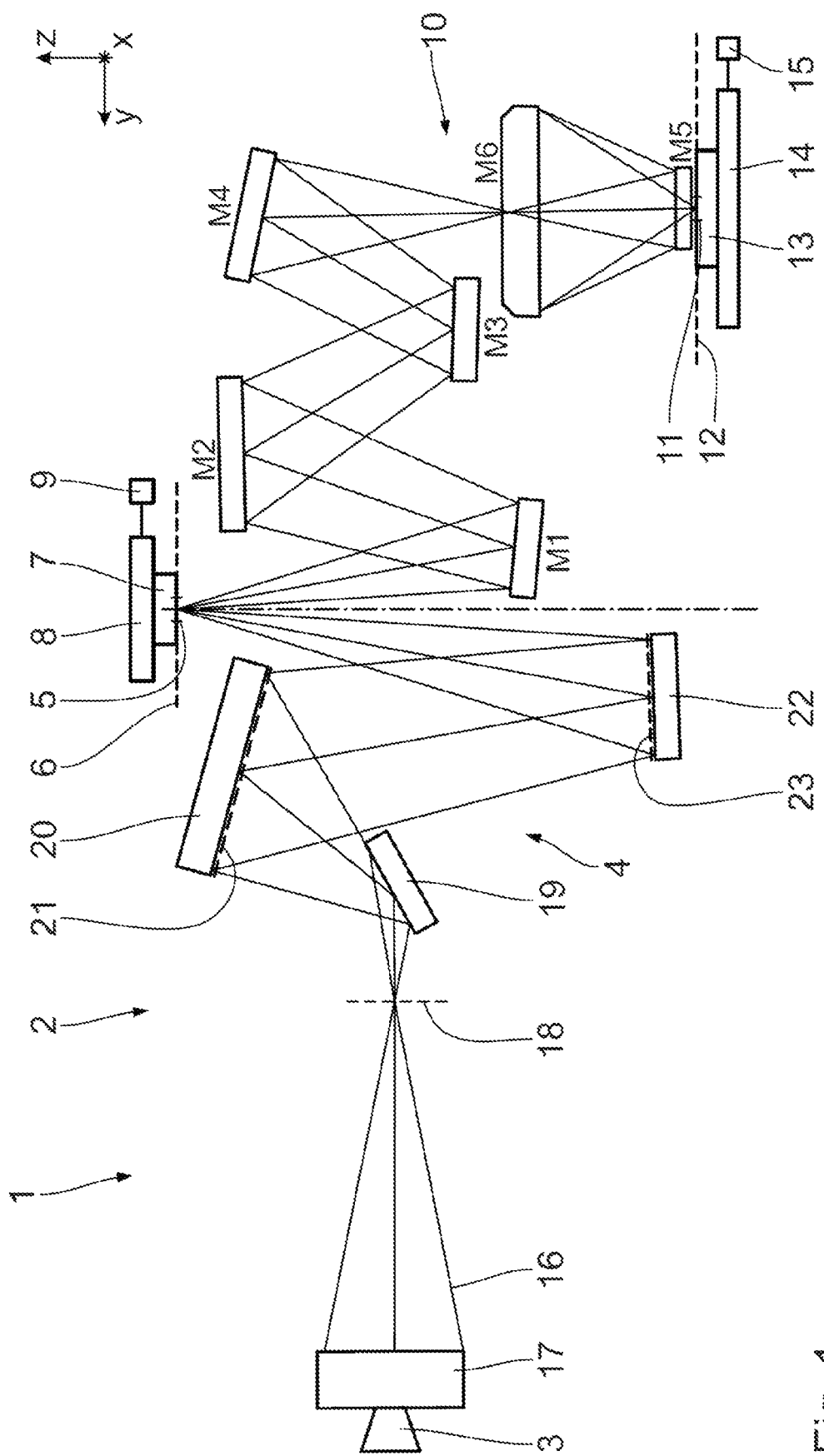
FIG. 1 schematically shows an exemplary embodiment of a projection exposure apparatus for EUV projection lithography in a meridional section.

FIG. 1 schematically shows an exemplary embodiment of a projection exposure apparatus 1 for EUV projection lithography in a meridional section.

In the following text, the component parts of a microlithographic projection exposure apparatus 1 are first described by way of example with reference to FIG. 1. The description of the basic construction of the projection exposure apparatus 1 and its components should not be understood as limiting the disclosed techniques. The disclosed techniques may be applied to projection exposure apparatuses with more, fewer or different components than those illustrated in apparatus 1.

One embodiment of an illumination system 2 of the projection exposure apparatus 1 has, in addition to a light or radiation source 3, an illumination optical unit 4 for illuminating an object field 5 in an object plane 6. In an alternative embodiment, the radiation source 3 may also be provided as a separate module from the remaining illumination system. In this case, the illumination system does not include the radiation source 3.

A reticle 7 arranged in the object field 5 is exposed. The reticle 7 is held by a reticle holder 8. The reticle holder 8 is displaceable in a scanning direction by way of a reticle displacement drive 9.

For purposes of explanation, a Cartesian xyz-coordinate system is shown in FIG. 1. The x-direction runs perpendicularly into the plane of the drawing. The y-direction runs horizontally and the z-direction runs vertically. The scanning direction runs along the y-direction in FIG. 1. The z-direction runs perpendicularly to the object plane 6.

The projection exposure apparatus 1 includes a projection optical unit 10. The projection optical unit 10 serves for imaging the object field 5 into an image field 11 in an image plane 12. The image plane 12 runs parallel to the object plane 6. Alternatively, an angle between the object plane 6 and the image plane 12 that differs from 0° is also possible.

It is shown that a structure on the reticle 7 is imaged onto a light-sensitive layer of a wafer 13, or some other substrate, arranged in the region of the image field 11 in the image plane 12. The wafer 13 is held by a wafer holder 14. The wafer holder 14 is displaceable along the y-direction by way of a wafer displacement drive 15. The displacement of the reticle 7 by way of the reticle displacement drive 9 may be synchronized with the displacement of the wafer 13 by way of the wafer displacement drive 15.

The radiation source 3 may be an EUV radiation source. The radiation source 3 emits an illumination radiation 16, which is also referred to below as used radiation or illumination light. In the exemplary embodiment shown, the illumination radiation 16 has a wavelength in the EUV range, and in particular in the range between 5 nm and 30 nm. The radiation source 3 may be a plasma source, for example an LPP source (Laser Produced Plasma) or a GDPP source (Gas Discharge Produced Plasma). It may also be a synchrotron-based radiation source. Similarly, the radiation source 3 may be a free electron laser (FEL).

The illumination radiation 16 emerging from the radiation source 3 is focused by a collector 17. The collector 17 may be a collector with one or more ellipsoidal and/or hyperboloidal reflection surfaces. The illumination radiation 16 may be incident on the at least one reflection surface of the collector 17 with grazing incidence (GI), i.e., at angles of incidence of greater than 45°, or with normal incidence (NI), i.e., at angles of incidence of less than 45°. The collector 17 may be structured and/or coated, on the one hand for optimizing its reflectivity for the illumination radiation 16 and on the other hand for suppressing extraneous light.

Downstream of the collector 17, the illumination radiation 16 propagates through an intermediate focus in an intermediate focal plane 18. The intermediate focal plane 18 may represent a separation between a radiation source module, having the radiation source 3 and the collector 17, and the illumination optical unit 4.

The illumination optical unit 4 includes a deflection mirror 19 and, arranged downstream thereof in the beam path, a first facet mirror 20. The deflection mirror 19 may be a plane deflection mirror or, alternatively, a mirror with a beam-influencing effect that goes beyond a purely deflecting effect. Alternatively or in addition, the deflection mirror 19 may be embodied as a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 includes a multiplicity of individual first facets 21, which are also referred to below as field facets. Only some of these facets 21 are shown in FIG. 1 by way of example.

The first facets 21 may be embodied as macroscopic facets, and in particular as rectangular facets or as facets with an arcuate peripheral contour or a peripheral contour of part of a circle. The first facets 21 may be embodied as plane facets or alternatively as convexly or concavely curved facets.

As known from, for example, DE 10 2008 009 600 A1, the first facets 21 themselves may also be composed of a multiplicity of individual mirrors, such as a multiplicity of micromirrors. The first facet mirror 20 may be formed, in particular, as a microelectromechanical system (MEMS system). For details, reference is made to DE 10 2008 009 600 A1.

Between the collector 17 and the deflection mirror 19, the illumination radiation 16 travels horizontally, i.e., along the y-direction.

In the beam path of the illumination optical unit 4, a second facet mirror 22 is arranged downstream from the first facet mirror 20. If the second facet mirror 22 is arranged in a pupil plane of the illumination optical unit 4, it is also referred to as a pupil facet mirror. The second facet mirror 22 may also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 includes a plurality of second facets 23. In the case of a pupil facet mirror, the second facets 23 are also referred to as pupil facets.

The second facets 23 may likewise be macroscopic facets, which may have, for example, a round, rectangular or else hexagonal periphery, or alternatively be facets made up of micromirrors. In this regard, reference is likewise made to DE 10 2008 009 600 A1.

The second facets 23 may have planar reflection surfaces or convexly or concavely curved reflection surfaces.

The illumination optical unit 4 consequently forms a twice-faceted system. This basic principle is also referred to as a honeycomb condenser (fly's eye integrator).

It may be advantageous to arrange the second facet mirror 22 not exactly in a plane that is optically conjugate to a pupil plane of the projection optical unit 10. In particular, the second pupil facet mirror 22 may be arranged so as to be tilted in relation to a pupil plane of the projection optical unit 10, as is described in, for example, DE 10 2017 220 586 A1.

With the aid of the second facet mirror 22, the individual first facets 21 are imaged into the object field 5. The second facet mirror 22 is the last beam-shaping mirror or the last mirror for the illumination radiation 16 in the beam path before the object field 5.

In a further embodiment of the illumination optical unit 4 that is not shown, a transmission optical unit contributing to the imaging of the first facets 21 into the object field 5 may be arranged in the beam path between the second facet mirror 22 and the object field 5. The transmission optical unit may have exactly one mirror or else alternatively two or more mirrors, which are arranged one behind the other in the beam path of the illumination optical unit 4. The transmission optical unit may include one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the field facet mirror 20 and the second facet mirror 22.

In a further embodiment of the illumination optical unit 4, there may be no need for the deflection mirror 19, and so the illumination optical unit 4 may have exactly two mirrors downstream of the collector 17, specifically the first facet mirror 20 and the second facet mirror 22.

The imaging of the first facets 21 into the object plane 6 by the second facets 23 or using the second facets 23 and a transmission optical unit is often only approximate imaging.

The projection optical unit 10 includes a plurality of mirrors Mi, which are consecutively numbered in accordance with their arrangement in the beam path of the projection exposure apparatus 1.

In the example shown in FIG. 1, the projection optical unit 10 includes six mirrors M1 to M6. Alternatives with four, eight, ten, twelve or any other number of mirrors Mi are similarly possible. The projection optical unit 10 is a twice-obscured optical unit. The penultimate mirror M5 and the last mirror M6 each have a through-opening, through which, during the exposure of the wafer 13, the radiation contributing to the exposure passes on its way from the reticle 7 to the wafer 13. The projection optical unit 10 has an image-side numerical aperture that is greater than 0.5, may also be greater than 0.6, and may be for example 0.7 or 0.75.

The reflection surfaces of the mirrors Mi may be embodied as freeform surfaces without an axis of rotational symmetry. Alternatively, the reflection surfaces of the mirrors Mi may be designed as aspherical surfaces with exactly one axis of rotational symmetry of the reflection surface form. Just like the mirrors of the illumination optical unit 4, the mirrors Mi may have highly reflective coatings for the illumination radiation 16. These coatings may be designed as multilayer coatings of, for example, alternating layers of molybdenum and silicon.

The projection optical unit 10 has a large object-image offset in the y-direction between a y-coordinate of a center of the object field 5 and a y-coordinate of the center of the image field 11. This object-image offset in the y-direction may be approximately the same size as a z-distance between the object plane 6 and the image plane 12.

The projection optical unit 10 may have an anamorphic form such that it has different imaging scales $\beta x$, $\beta y$ in the x- and y-directions. The two imaging scales $\beta x$, $\beta y$ of the projection optical unit 10 are preferably at $(\beta x, \beta y)=(+/-0.25, +/-0.125)$. A positive imaging scale ß means imaging without an image reversal. A negative sign for the imaging scale B means imaging with an image reversal.

The projection optical unit 10 consequently leads to a reduction in size with a ratio of 4:1 in the x-direction, i.e., in a direction perpendicular to the scanning direction.

The projection optical unit 10 leads to a reduction in size of 8:1 in the y-direction, i.e., in the scanning direction.

Other imaging scales are similarly possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 may be the same or, depending on the embodiment of the projection optical unit 10, may differ. Examples of projection optical units 10 with different numbers of such intermediate images in the x-direction and y-direction are known from US 2018/0074303 A1.

In each case one of the second facets 23 is assigned to exactly one of the first facets 21 for respectively forming an illumination channel for illuminating the object field 5. This may produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner superposed on one another for the purposes of illuminating the object field 5. The illumination of the object field 5 may be as homogeneous as possible. The illumination of the object field 5 may preferably have a uniformity error of less than 2%. The field uniformity can be achieved by way of the superposition of different illumination channels.

The illumination of the entrance pupil of the projection optical unit 10 may be defined geometrically by an arrangement of the second facets 23. The intensity distribution in the entrance pupil of the projection optical unit 10 may be set by selecting the illumination channels, in particular the subset of the second facets 23, which guide light. This intensity distribution is also referred to as illumination setting or illumination pupil filling.

A likewise preferred pupil uniformity in the region of defined illuminated sections of an illumination pupil of the illumination optical unit 4 can be achieved by a redistribution of the illumination channels.

Further aspects and details of the illumination of the object field 5, and in particular of the entrance pupil of the projection optical unit 10, are described below.

For example, the projection optical unit 10 may have a homocentric entrance pupil. The latter may be accessible. It may also be inaccessible.

The entrance pupil of the projection optical unit 10 often may not be exactly illuminated with the second facet mirror 22. When imaging the projection optical unit 10, which images the center of the second facet mirror 22 telecentrically onto the wafer 13, the aperture rays may not intersect at a single point. However, it is possible to find an area in which the distance of the aperture rays determined in pairs becomes minimal. This area represents the entrance pupil or an area in real space that is conjugate thereto. In particular, this area has a finite curvature.

It may be that the projection optical unit 10 has different positions of the entrance pupil for the tangential beam path and for the sagittal beam path. In this case, an imaging element, such as an optical component of the transmission optical unit, should be provided between the second facet mirror 22 and the reticle 7. With the aid of this optical element, the different position of the tangential entrance pupil and the sagittal entrance pupil may be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 6. The first facet mirror 20 is arranged so as to be tilted in relation to an arrangement plane defined by the deflection mirror 19.

The first facet mirror 20 is arranged so as to be tilted in relation to an arrangement plane defined by the second facet mirror 22.

Figure 2:
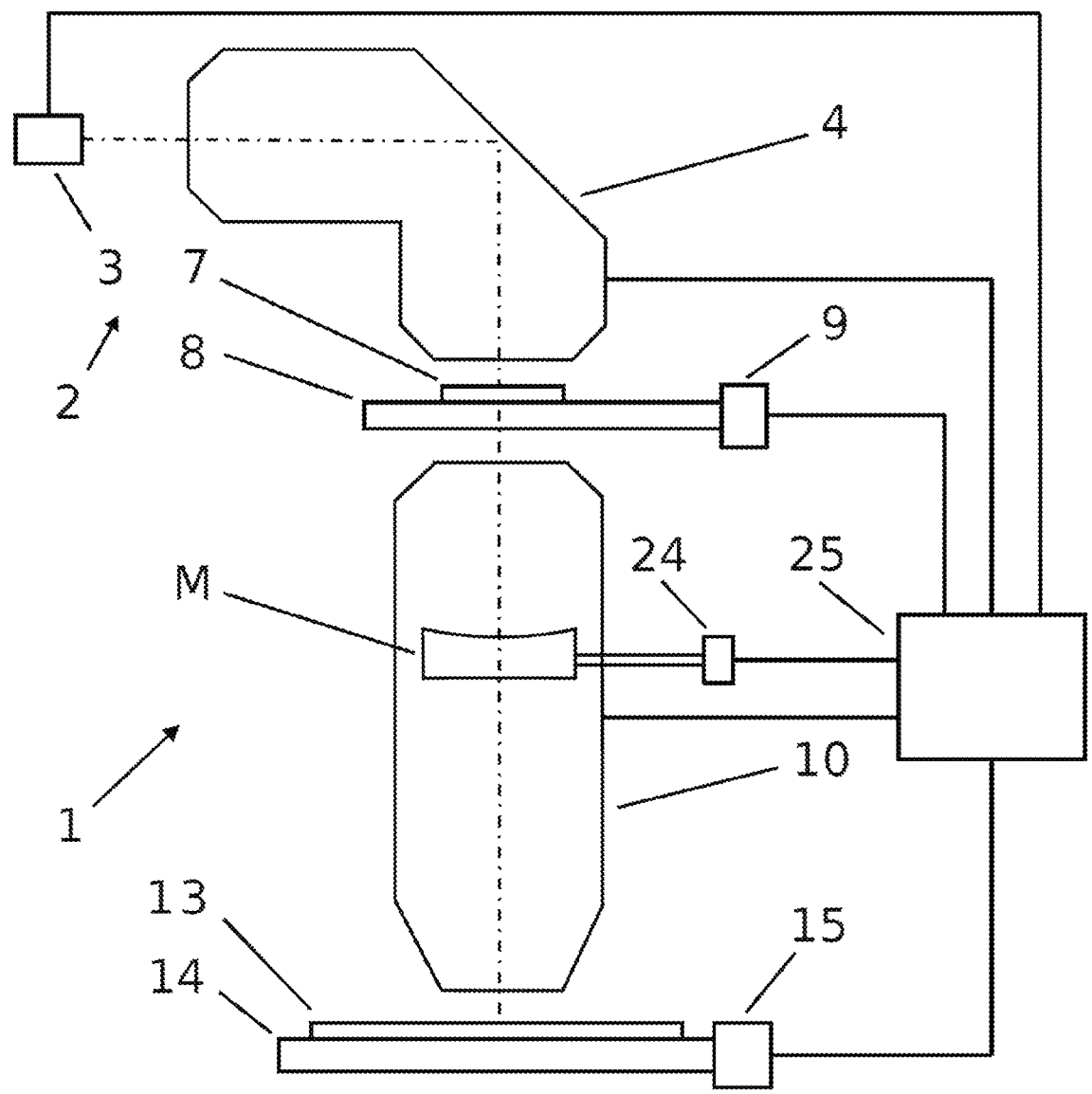
FIG. 2 shows an exemplary embodiment of a projection exposure apparatus for DUV projection lithography in a schematic representation.

FIG. 2 shows an exemplary embodiment of a projection exposure apparatus 1 for DUV projection lithography in a schematic representation. DUV stands here for "Deep Ultraviolet." Accordingly, the projection exposure apparatus 1 may be designed for operation at a wavelength of 193 nm.

The projection exposure apparatus 1 has an illumination optical unit 4 and a projection optical unit 10. The internal structure of the illumination optical unit 4 and the internal structure of the projection optical unit 10, which may in each case include, for example, optical components, sensors, manipulators etc., are not shown in detail. In the case of the projection optical unit 10, a mirror M is indicated as representative of its optical components. The mirror M may be cooled with the aid of a cooling medium, which is provided by a cooling device 24. The cooling medium is a fluid, such as water. In addition or alternatively, the illumination optical unit 4 may have a cooled mirror M and an associated cooling device 24. The projection optical unit 10 and/or the illumination optical unit 4 may also have a number of cooled mirrors M and cooling devices 24. In the case of the illumination optical unit 4 and in the case of the projection optical unit 10, lenses and further mirrors—cooled or uncooled—may, for example, be present as further optical components.

By analogy, at least one cooling device 24, which may for example be connected to the mirror M3, may also be provided in the exemplary embodiment of the projection exposure apparatus 1 shown in FIG. 1.

The radiation required for the operation of the projection exposure apparatus 1 is generated by a radiation source 3. The radiation source 3 may be, for example, an excimer laser, such as an argon fluoride laser, which generates illumination radiation 16 of the wavelength 193 nm.

Arranged between the illumination optical unit 4 and the projection optical unit 10 is a reticle holder 8, fixed on which is a reticle 7, also referred to as a mask. The reticle holder 8 has a reticle displacement drive 9. Arranged downstream of the projection optical unit 10, seen in the direction of radiation, is a wafer holder 14, which carries a wafer 13 or some other substrate, and has a wafer displacement drive 15.

Also shown furthermore in FIG. 2 is a control device 25, which is connected to the illumination optical unit 4, the projection optical unit 10, the cooling device 24, the radiation source 3, the reticle holder 8 or the reticle displacement drive 9 and the wafer holder 14 or the wafer displacement drive 15. By analogy, the projection exposure apparatus of FIG. 1 may likewise have a control device 25, which may be connected to corresponding components.

The projection exposure apparatus 1 serves the purpose of imaging the reticle 7 onto the wafer 13 with high precision. For this purpose, the reticle 7 is illuminated with the aid of the illumination optical unit 4 and the illuminated reticle 7 is imaged onto the wafer 13 with the aid of the projection optical unit 10. Specifically, the following procedure is adopted:

The illumination optical unit 4 transforms the illumination radiation 16 generated by the radiation source 3 in an exactly defined way by its optical components and guides it onto the reticle 7. Depending on the embodiment, the illumination optical unit 4 may be formed such that it illuminates the entire reticle 7 or only a partial region of the reticle 7. The illumination optical unit 4 is capable of illuminating the reticle 7 such that there are almost identical illumination conditions at each illuminated point of the reticle 7. In particular, the intensity and the angular distribution of the incident illumination radiation 16 are almost identical for each illuminated point of the reticle 7.

The illumination optical unit 4 is capable of illuminating the reticle 7 optionally with illumination radiation 16 of a multiplicity of different angular distributions. These angular distributions of the illumination radiation 16 are also referred to as illumination settings. The desired illumination setting is generally selected based on the structural elements formed on the reticle 7. For example, dipole or quadrupole illumination settings are often used when the illumination radiation 16 is incident on each illuminated point of the reticle 7 from two different directions or from four different directions, respectively. Depending on the form of the illumination optical unit 4, the different illumination settings may be produced by, for example, different diffractive optical elements in combination with a zoom axicon optical unit or by mirror arrays, which have in each case a multiplicity of small mirrors that are arranged next to one another and are individually adjustable with respect to their angular position.

The reticle 7 may be formed as, for example, a glass plate, which is transparent to the illumination radiation 16 supplied by the illumination optical unit 4 and applied to which are opaque structures, for example in the form of a chromium coating.

The projection exposure apparatus 1 may be formed such that the entire reticle 7 is illuminated at the same time by the illumination optical unit 4 and is imaged completely onto the wafer 13 by the projection optical unit 10 in a single exposure step.

Alternatively, the projection exposure apparatus 1 may also be formed such that only a partial region of the reticle 7 is illuminated at the same time by the illumination optical unit 4 and the reticle displacement drive 9 is activated by the control device 25 such that, during the exposure of the wafer 13, the reticle 7 is moved in relation to the illumination optical unit 4 and, as a result, the illuminated partial region migrates over the reticle 7 as a whole. The wafer 13 is moved synchronously by a suitably adjusted activation of the wafer displacement drive 15, in which the imaging properties of the projection optical unit 10 are also taken into account, and so the respectively illuminated partial region of the reticle 7 is imaged onto a partial region of the wafer 13 provided for it. This movement of the reticle 7 and the wafer 13 is also referred to as scanning.

In order to transfer the latent image produced by the exposure of the wafer 13 in both embodiments of the projection exposure apparatus 1 into a physical structure, a light-sensitive layer is applied to the wafer 13. The image of the reticle 7 is formed in this light-sensitive layer by exposure and a permanent structure can be produced from it on the wafer 13 with the aid of subsequent chemical processes.

The reticle 7 is generally imaged onto the wafer 13 not only once, but multiple times next to one another. For this purpose, after each imaging of the reticle 7 onto the wafer 13, the wafer holder 14 is displaced laterally in a way corresponding to the size of the image of the reticle 7 on the wafer 13. The imaging of the reticle 7 may be performed here in each case as a whole or sequentially by scanning. The chemical treatment of the wafer 13 is only started when the desired number of imagings of the reticle 7 onto the wafer 13 have been carried out.

Figure 3:
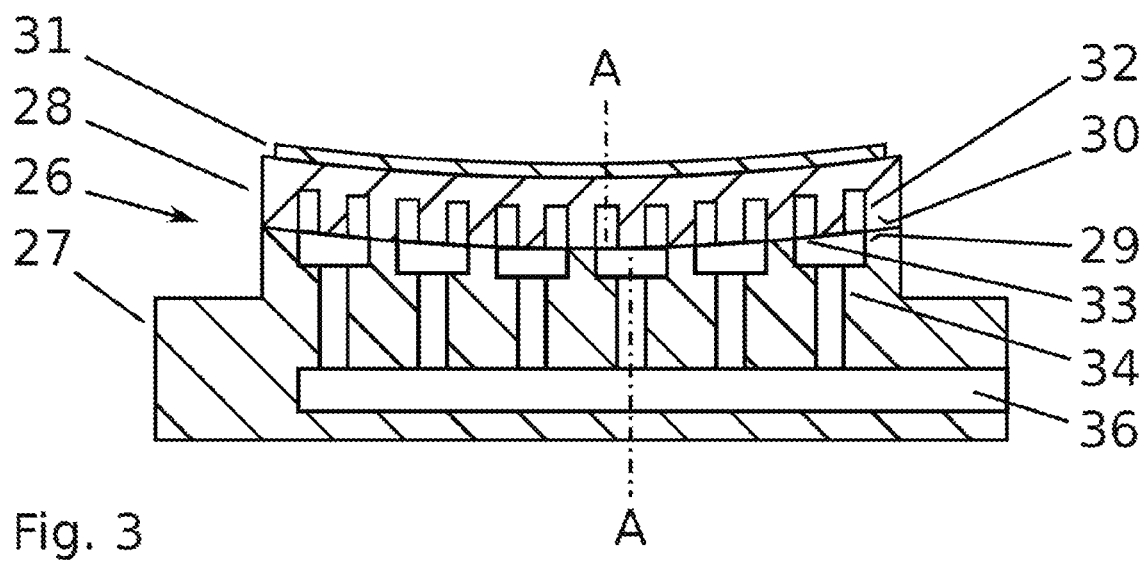
FIG. 3 shows an exemplary element of a mirror in a schematic sectional representation that has been produced by the method according to the disclosed techniques.
Figure 4:
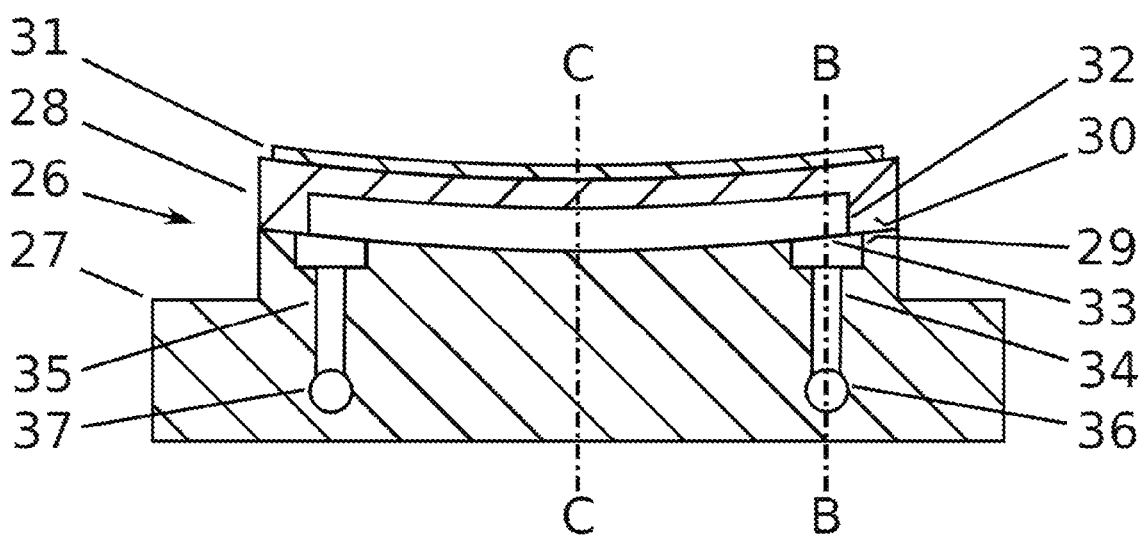
FIG. 4 shows the first exemplary embodiment of the mirror, represented in FIG. 3, in a further schematic sectional representation.

FIG. 3 shows an exemplary embodiment of a mirror 26 in a schematic sectional representation that has been produced by the method according to the disclosed techniques. FIG. 4 shows the same exemplary embodiment of the mirror 26 in a further schematic sectional representation, in which the section is taken along a sectional line A-A depicted in FIG. 3. To be able to represent as many details of the mirror 26 as possible, the sectional line A-A has a lateral offset as it passes through the mirror 26. In FIG. 3, the section is taken along the sectional line B-B shown in FIG. 4. In FIGS. 3 and 4, the representation of the mirror 26 and its component parts is not to scale and is highly abstract, in order to present the disclosed techniques as clearly as possible. This also applies to all of the other figures.

In the case of one of the projection exposure apparatuses 1 shown in FIGS. 1 and 2, the mirror 26 can be used and has a lower part 27 and an upper part 28, which are in each case produced from quartz glass, Ti-doped quartz glass or a glass ceramic. The terms "lower part" and "upper part" have been chosen because the lower part 27 is generally formed much thicker than the upper part 28, and consequently the lower part 27 carries the upper part 28. The terms do not however have anything to do with the orientation of the mirror 26 in relation to the direction of gravitational force in the fitted state of the mirror 26. During the operation of the projection exposure apparatus 1, the upper part 28 may be arranged above or below or alongside the lower part 27 with respect to the direction of gravitational force, or assume some other relative position with respect to it. The lower part 27 is also referred to as the first mirror part 27 and the upper part 28 is also referred to as the second mirror part 28.

The lower part 27 and the upper part 28 are rigidly connected to one another in the region of a connecting surface 29 of the lower part 27 and a connecting surface 30 of the upper part 28 by the method according to the disclosed techniques described in more detail below. In the exemplary embodiment shown, the connecting surface 29 of the lower part 27 is formed in a concavely curved manner. The curvature may be formed spherically, aspherically or according to a freeform surface. The connecting surface 30 of the upper part 28 is curved in a way complementary to the connecting surface 29 of the lower part 27, and accordingly has a convex curvature, which may be formed spherically, aspherically or according to a freeform surface. Consequently, the connecting surface 30 of the upper part 28 and the connecting surface 29 of the lower part 27 can engage with one another in close contact. As an alternative to a curved formation, the connecting surface 29 of the lower part 27 and the connecting surface 30 of the upper part 28 may also be formed in a planar manner.

On the side of lower part 27 that is facing away from its connecting surface 29 shown at the bottom in FIG. 3, the lower part 27 is formed in a planar manner. On the side of upper part 28 that is facing away from its connecting surface 30 shown at the top in FIG. 3, the upper part 28 is formed in a concavely curved manner and has a reflective optical surface 31 with an identical curvature. The curvature may be formed as spherical, aspherical or according to a freeform surface and, in particular, corresponding to the curvature of the connecting surface 30 of the upper part 28. Even when the connecting surfaces 29 and 30, the surface of the upper part 28 facing away from the connecting surface 30 and the optical surface 31 are formed in each case in a rotationally symmetrical manner, they respectively have in the sectional areas of FIGS. 3 and 4 a slightly different curvature, since these sectional areas are formed at different distances from the centers of the surfaces mentioned. However, the differences in distance in comparison with the absolute values of the radii of curvature are in each case very small, and so different curvatures are not perceptible in the representations of FIGS. 3 and 4.

As an alternative to this, it is also possible that the optical surface 31 is formed in a planar manner. This may be the case when the connecting surface 29 of the lower part 27 and the connecting surface 30 of the upper part 28 are formed in a planar manner.

The optical surface 31 is embodied as a coating applied to the upper part 28. The formation of the coating depends on at which wavelength the optical surface 31 is intended to produce its reflective effect. In the case of a desired reflection in the DUV range, e.g., in the case of the mirror M of FIG. 2, the coating may be formed as an aluminum layer. If, on the other hand, a reflection in the EUV range is intended, as in the case for example of the mirror M3 of FIG. 1, the coating may be formed from, for example, alternately successive layers of silicon and molybdenum and possibly one or more further layers of a different composition and serving for example as protective layers.

The upper part 28 also has a number of elongate cooling channels 32, which run parallel to one another and to the optical surface 31 and extend laterally in the region of the optical surface 31 and possibly somewhat beyond it. Accordingly, the cooling channels 32 in the case of the exemplary embodiment shown are formed in a curved manner. The cooling channels 32 reach up toward the optical surface 31 to within a distance of about 1 to 6 mm and are formed as open toward the connecting surface 30 of the upper part 28. Accordingly, the cooling channels 32 have elongate cooling channel openings 33 in the region of the connecting surface 30 of the upper part 28. The transverse dimensions of the cooling channel 32 may be about 0.2 to 10 mm, the depth of the cooling channels 32, i.e., the dimension approximately perpendicular to the connecting surface 30 of the upper part 28, generally being considerably greater than the width, i.e., the dimension approximately parallel to the connecting surface 30 of the upper part 28. For example, the depth of the cooling channel 32 may be more than twice the width of the cooling channels 32. The clear distance between adjacent cooling channels 32 is generally less than or equal to 15 mm, and preferably less than or equal to 5 mm. The values for the width of the cooling channels 32, for the clear distance between adjacent cooling channels 32 and for the distance between the cooling channels 32 and the optical surface 31 may be approximately the same.

In the case of a formation of the connecting surface 30 of the upper part 28 that is not rotationally symmetrical, it may have different average radii of curvature for different azimuth angles, or to put it another way, with respect to different directions. In this case, the region of the connecting surface 30 of the upper part 28 within which the absolute amount of the average radius of curvature has the greatest value may run in a direction transverse, in particular perpendicular, to the longitudinal extents of the cooling channel openings 33. Mutually adjacent regions of the connecting surface 29 of the lower part 27 and the connecting surface 30 of the upper part 28 may in the unconnected state have slightly different average radii of curvature, the average radius of curvature of the region of the convexly formed surface generally having a smaller absolute value than the average radius of curvature of the corresponding region of the concavely formed surface.

The lower part 27 has a number of distributor channels 34 and collector channels 35, which extend from the connecting surface 29 of the lower part 27 in the direction of the side of the lower part 27 facing away from the connecting surface 29 into the lower part 27. Inside the lower part 27, the distributor channels 34 open out into a fluid distributor 36 and the collector channels 35 open out into a fluid collector 37. The distributor channels 34 and the collector channels 35 widen in each case in a step-shaped manner toward the connecting surface 29 of the lower part 27 and respectively overlap there with the opposite ends of two cooling channel openings 33. In other words, one distributor channel 34 respectively overlaps with one end of two cooling channel openings 33 and one collector channel 35 respectively overlaps with the two other ends of the same two cooling channel openings 33. Accordingly, one distributor channel 34 is fluidically connected at its one end to the fluid distributor 36 and at its other end to two cooling channels 32. By analogy, one collector channel 35 is fluidically connected at its one end to the fluid collector 37 and at its other end to two cooling channels 32.

It is consequently possible to supply a fluid, for example water, to the cooling channels 32 through the fluid distributor 36 and to the distributor channels 34, each distributor channel 34 respectively supplying two cooling channels 32 and the fluid distributor 36 supplying all of the distributor channels 34 with fluid. The fluid flows through the cooling channel 32 and then flows on via the collector channels 35 into the fluid collector 37, via which it can be removed. In this case, the fluid of every two cooling channels 32 flows respectively into one collector channel 35 and the fluid of all the collector channels 35 flows into the fluid collector 37. The supply of the fluid to the fluid distributor 36 and the removal of the fluid from the fluid collector 37 can take place with the aid of the cooling device 24, which for this purpose can be connected to the fluid distributor 36 and the fluid collector 37.

Adjusting the temperature of the supplied fluid to a temperature below the temperature of the upper part 28 can achieve the effect that the fluid extracts heat from the upper part 28 as it flows through the cooling channel 32. This extraction of heat may be intended to compensate for the input of heat due to the radiation that is incident on the optical surface 31 during the operation of the lithographic system. Since the optical surface 31 does not completely reflect the incident radiation, part of the radiation is absorbed by the optical surface 31 and, depending on the formation of the optical surface 31, also absorbed by the upper part 28 and converted into heat. Since the optical surface 31 and the upper part 28 have a certain thermal conductivity, part of this heat is directed to the cooling channels 32 and can be taken up there by the fluid and transported away. In this way, the rise in temperature of the mirror 26 caused by the radiation can be limited and the deformation of the optical surface 31 caused by effects of thermal expansion can be reduced in comparison with an uncooled mirror 26. As a consequence, the imaging errors caused by the deformation are also reduced.

The formation and arrangement of the cooling channels 32, the distributor channels 34, the collector channels 35, the fluid distributor 36 and the fluid collector 37 may also be modified in various ways. For example, the cooling channels 32 may be arranged in the lower part 27 and be formed as open toward the connecting surface 29 of the lower part 27, and so the cooling channels 32 have elongate cooling channel openings 33 in the region of the connecting surface 29 of the lower part 27. There may also be no need for the distributor channels 34 and the collector channels 35, and the fluid distributor 36 and the fluid collector 37 may be connected directly to the cooling channels 32 etc.

For producing the mirror 26, the lower part 27 and the upper part 28 are produced as separate parts and then connected to one another. The optical surface 31 is generally only formed after connecting the lower part 27 and the upper part 28, in order to achieve the highest possible precision, in particular with respect to its form, and to avoid damage to the optical surface 31 during the connecting process. A material with a very low coefficient of thermal expansion is used for the production of the lower part 27 and the upper part 28. Suitable materials are, for example, quartz glass, quartz glass doped with titanium oxide or special glass ceramics. The lower part 27 and the upper part 28 may be cut out from a common material blank. However, there is also the possibility of using different material blanks for the lower part 27 and the upper part 28 if they do not differ too much from one another with respect to their material parameters.

For example, a quartz glass mixed with titanium oxide, which has a zero crossing temperature averaged over the volume of the lower part 27 of between 22 and 25° C., may be used for the production of the lower part 27. The zero crossing temperature has been adjusted here to match the expected temperature of the lower part 27, taking into account the cooling of the mirror 26, during the operation of the lithographic system. Depending on the method for producing the material used for the lower part 27, the increase in the coefficient of thermal expansion at 22° C. is preferably less than about 1.35 ppb/K$^2$. At least within a region which overlaps laterally with the optical surface 31 in the finished mirror 26, the zero crossing temperature has a homogeneity of better than +/−5 K, the homogeneity being better in the region of the connecting surface 29 of the lower part 27 than on the side facing away from it.

The lower part 27 is cut out from the material blank and then worked by grinding and polishing. The connecting surface 29 of the lower part 27 here may be brought into a form that corresponds approximately to the intended form of the optical surface 31, which is formed at a later time on the upper part 28. The form deviation between the connecting surface 29 of the lower part 27 and the optical surface 31 is less than or equal to 3 mm, preferably less than or equal to 200 μm. If the connecting surface 29 of the lower part 27 has a circular peripheral border, its diameter is generally between 20 and 100 cm with a sagitta of up to 3% of the diameter. A spherical basic form of the connecting surface 29 of the lower part 27 may be overlaid with any desired function, and so a freeform surface can be obtained.

With respect to a wavelength $\lambda$ of 633 nm used for the measurement, the polishing of the connecting surface 29 of the lower part 27 may take place with a deviation from a predefined form (figure) of less than $\lambda/2$, and preferably less than $\lambda/10$. Furthermore, a roughness of less than 5 nm, and preferably less than 1 nm, may be achieved in this case. The term "roughness" in this case subsumes the randomly distributed deviations from a smooth surface. Form or figure deviations are considered to include both longwave deviations from the predefined form and shortwave, more point-like, not randomly distributed deviations. The longwave form deviation may also turn out to be somewhat greater than the aforementioned values of $\lambda/2$ and $\lambda/10$. With respect to the shortwave deviation, the values mentioned are however maintained wherever possible. For example, deviations with spatial frequencies of several cm do not have such a disruptive effect. Deviations with spatial frequencies below 100 μm are generally much more disruptive.

In order to avoid drying in of remains of grinding and polishing agents, the lower part 27 is rinsed off after the grinding and polishing. Furthermore, mechanical wet cleaning may be carried out. The surface of the lower part 27 may be additionally cleaned with solvents, organic and inorganic cleaning agents or by a plasma treatment, etc.

When working the lower part 27, damage at depth should be avoided because small amounts of water and other process agents, such as polishing agents or contaminants, can be left behind in micro cracks and they may evaporate away and lead to local blistering when the lower part 27 is heated up. To avoid or eliminate possible damage at depth, dry and/or wet etching steps or other suitable optical working steps may be used. Furthermore, graduated grinding steps may be used, or contactless removal performed, for example, by etching with oxygen plasma, which may be followed by a polishing step. Freedom from damage at depth is demonstrated by, for example, briefly etching with fluoric acid without leading to local etch pits. A fluoric acid bath is suitable at the same time as a cleaning step for removing hydrocarbons.

After the grinding and polishing or lapping, the distributor channels 34 and the collector channels 35 as well as the fluid distributor 36 and the fluid collector 37 are formed in the lower part 27, if applicable Depending on the formation of the lower part 27, the cooling channels 32 may also be formed in the lower part 27. The distributor channels 34 and the collector channels 35 as well as the fluid distributor 36 and the fluid collector 37 generally have transverse dimensions, i.e., dimensions transverse to the direction of flow of the fluid, that are much greater than the corresponding dimensions of the cooling channels 32.

The respective channels may be formed by milling, grinding, drilling, laser ablation, ultrasound ablation, etching or a combination of these methods. Finally, etching with fluoric acid may be provided to avoid later crack propagation and to form a surface in the channels that is only slightly roughened in a way conducive to flow.

In order to protect the already worked, in particular polished, surface of the lower part 27 from breakouts at the edges, for example at the peripheries of the cooling channel openings 33, and from similar damage, a protective resist may be applied to the surface of the lower part 27 before the forming of the channels. Any breakouts at the edges that occur in spite of this precautionary measure may be smoothed out locally or eliminated by a bevel running around, for example, the cooling channel openings 33. However, this bevel is disadvantageous in terms of flow and in terms of strength because of the notch effect, and should be avoided, if possible.

As an alternative to the procedure described above, the channels in the lower part 27 are formed before the working of the surface of the lower part 27 by grinding, lapping and/or polishing. This, however, results in a certain rounding at the edges of the cooling channel openings 33 or other openings, because, for example, the polishing disks have a finite stiffness and bulge into the cooling channel openings 33 or other openings. This rounding at the edges can be counteracted by inserting or cementing in placeholders of the same material as the lower part 27 into the cooling channel openings 33 or other openings. The placeholders are ground away and polished together with the connecting surface 29 of the lower part 27 and reduce the widths of the gaps caused by the cooling channel openings 33 or other openings. The gaps remaining between the placeholders and the surrounding material of the lower part 27 may also be grouted with a glass- or ceramic-powder-filled putty, and so during the polishing there is at most slight bulging, and accordingly very little rounding at the edges. Alternatively, local reworking may take place by robot polishing or ion beam polishing to minimize the rounding at the edges After the working of the surface of the lower part 27, the placeholders, and if applicable the grouting material, are removed again.

In order to avoid, or at least reduce, rounding at the edges, ablating or etching methods may be used as an alternative to mechanical surface working. If, within these methods, a resist mask is applied to the regions that are not to be worked, underetching may occur in the peripheral regions of the resist mask. The adverse effects of this underetching can be counteracted by suitable mechanical, laser-ablative or etching reworking.

A material with identical or similar properties as described for the lower part 27 may be used for the production of the upper part 28. The material properties of the upper part 28 may only deviate within predefined limits from the material properties of the lower part 27. For example, a very different thermal expansion behavior of the lower part 27 and the upper part 28 would be problematic because the lower part 27 and 28 are rigidly connected to one another.

After the cutting out of the upper part 28 from the material blank, the surface of the upper part 28, in particular the connecting surface 30, may be worked in an analogous way to that described for the lower part 27, and analogous requirements with respect to form deviation and roughness may be met. The requirements with respect to the form deviation can be relaxed somewhat if the upper part 28 is comparatively thin.

Depending on the variant of the embodiment, the upper part 28 may have cooling channels 32 and/or other channels, such as, for example, distributor channels 34 and collector channels 35. All of these channels may be produced in an analogous way to that described for the lower part 27 and analogous measures may be used for reducing the rounding at the edges, etc.

The upper part 28 generally has a thickness of between 10 and 40 mm, but under certain preconditions it may have a smaller thickness. Depending on the thickness, it may be necessary to cement or wring the upper part 28 onto a glass substrate as a carrier material for working in order to achieve a stiffness sufficient for precise working.

Tools that have the same or very similar nominal curvature as the tools for working the connecting surface 29 of the lower part 27 may be used for the working of the connecting surface 30 of the upper part 28 by grinding, lapping and/or polishing. Optionally, a further step may be provided after that, in which the actual forms of the connecting surface 29 of the lower part 27 and the connecting surface 30 of the upper part 28 are measured and the connecting surface 30 of the upper part 28 is locally adapted to the connecting surface 29 of the lower part 27 by robot polishing, plasma etching, ion beam ablation or compacting high-energy irradiation.

In the case of embodiments of the mirror 26 in which the connecting surface 29 of the lower part 27 is substantially planar or has a very small curvature, and so the absolute value of the average radius of curvature for at least one azimuth angle is greater than 10 m, there is the possibility of using a comparatively thin upper part 28, which has a thickness of 0.5 to 10 mm, and of forming the connecting surface 30 of the upper part 28 in a planar manner. In this case, the upper part 28 may be deformed as it is being connected to the lower part 27, and as a result the connecting surface 30 of the upper part 28 may be adapted to the form of the connecting surface 29 of the lower part 27. For the working required before the connection, the upper part 28 may be cemented onto a sufficiently rigid carrier material or wrung onto the carrier material As an alternative to the use of an upper part 28 cut out from a material blank, a thin upper part 28 of titanium-doped quartz glass may also be produced by flowing out, for example on molten metal (float glass), pouring over a long break-away edge, pressing and sintering of glass soot or indirectly by way of a gray body. These methods have the advantage that the upper part 28 is produced from a sheet a few millimeters thick, in which good homogeneity with respect to the material parameters can be achieved, and that it may be possible to dispense with mechanical working. To be able to achieve similar thermal expansion behavior as in the case of the lower part 27 with an upper part 28 from such a sheet, the OH content of the sheet should deviate by less than or equal to 5% and the titanium content of the sheet should deviate by less than or equal to 0.05% from the respective content of the lower part 27. In the case of very thin sheets from which upper parts 28 with thicknesses of less than 2 mm are produced, these requirements can also be relaxed somewhat.

When the lower part 27 and the upper part 28 have been finished, they can be connected to one another in the region of their connecting surfaces 29, 30. The connection is performed in two steps: In a first step, the upper part 28 is wrung onto the lower part 27, i.e. is brought up so close to the lower part 27 that it becomes attached to the lower part 27 as a result of the Van-der-Waals forces between the atoms of the lower part 27 and the atoms of the upper part 28. With this first step, which may take place at room temperature, an intermediate product including the lower part 27 and the upper part 28 is produced. In a second step, the connection between the upper part 28 and the lower part 27 is strengthened by a bonding process, by which covalent bonds are formed between the atoms of the lower part 27 and the atoms of the upper part 28, and so the upper part 28 and the lower part 27 are durably connected very strongly to one another. The procedure according to the disclosed techniques within the bonding process and the preparations taken for this are explained in more detail below.

Figure 5:
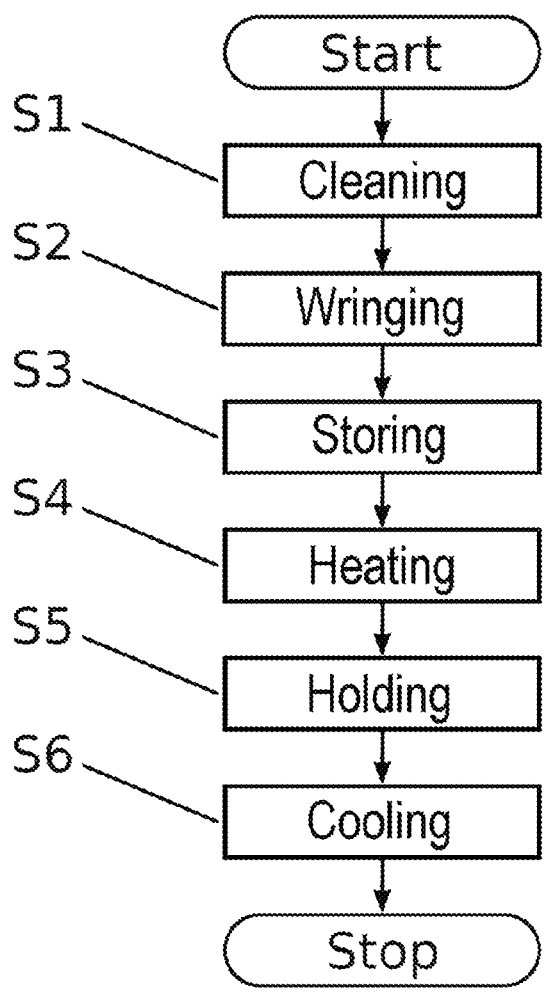
FIG. 5 shows a flow diagram for explaining the procedure according to the disclosed techniques when connecting the lower part and the upper part and FIG. 6 shows a snapshot during the wringing of the upper part onto the lower part in a schematic sectional representation.

FIG. 5 shows a flow diagram explaining the procedure according to the disclosed techniques when connecting the lower part 27 and the upper part 28. The lower part 27 and the upper part 28 may be produced in the way described above in processes that proceed approximately in parallel or completely independently of one another in processes that are separate in terms of space and/or time.

To make it possible to form a durable connection, in a step S1 the lower part 27 and the upper part 28 are cleaned, activated and dried, in particular in the region of their connecting surfaces 29, 30. For example, the connecting surface 29 of the lower part 27 and the connecting surface 30 of the upper part 28 may be simultaneously cleaned, ablated and activated by etching, for example with fluoric acid, by sputtering or by plasma treatment, in particular with hydrogen or oxygen plasma.

Step S1 is followed by step S2, in which the upper part 28 is wrung onto the lower part 27. For wringing onto the lower part 27, the connecting surface 30 of the upper part 28 is brought up so close to the connecting surface 29 of the lower part 27 that a strong attraction occurs as a result of the Van-der-Waals forces between the atoms near the surface of the upper part 28 and the atoms near the surface of the lower part 27, and ultimately connects the upper part 28 and the lower part 27 to one another. Since the Van-der-Waals forces only act over very short distances, it is necessary to bring the connecting surface 30 of the upper part 28 and the connecting surface 29 of the lower part 27 very close together. This is only possible within a relatively large surface area if the connecting surface 30 of the upper part 28 and the connecting surface 29 of the lower part 27 are very smooth, have almost exactly the same form, and are largely free from contaminants. It is also of great importance for bringing the connecting surface 30 of the upper part 28 and the connecting surface 29 of the lower part 27 sufficiently close together to prevent as much as possible inclusions of air or other gases between the connecting surfaces 30, 29. These gas inclusions may also have adverse effects during the later use of the mirror 28. A possible procedure for the wringing is shown in FIG. 6.

Figure 6:
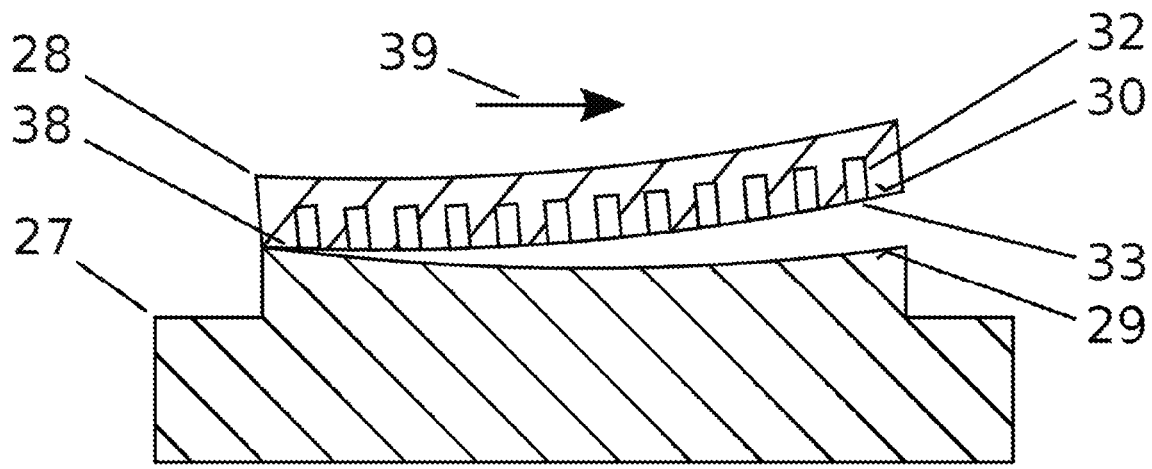

FIG. 6 shows a snapshot during the wringing of the upper part 28 onto the lower part 27 in a schematic sectional representation, the section being taken along a sectional line C-C shown in FIG. 4, and consequently perpendicular to the longitudinal extents of the cooling channels 32.

In the case of the exemplary embodiment shown, the connecting surface 29 of the lower part 27 and the connecting surface 30 of the upper part 28 have at least approximately complementary curvatures. As can be seen from FIG. 6, the connecting surface 30 of the upper part 28 is not brought up to the connecting surface 29 of the lower part 27 in parallel alignment over the full surface area, but instead the connecting surfaces 29, 30 form an angle with one another when they are brought together and initially only meet one another in the region of their peripheral surfaces shown on the left in FIG. 6. In FIG. 6, the angle is exaggerated in order that the effect can be seen. As they are brought together, initially there is only contact between the upper part 28 and the lower part 27 in a small region of the connecting surfaces 29, 30, and so initially only a comparatively small contact surface 38 is formed between the upper part 28 and the lower part 27. Van-der-Waals forces produce their attractive effect within the contact surface 38, and so wringing of the connecting surface 30 of the upper part 28 onto the connecting surface 29 of the lower part 27 occurs in the region of the contact surface 38.

The upper part 28 is then successively pivoted further toward the lower part 27 and thereby brought ever closer to it, and so the contact surface 38 increases in size. Accordingly, the surface area within which the upper part 28 is wrung onto the lower part 27 also increases in size. The linearly formed transition between the wrung region of the connecting surfaces 29, 30 and the non-wrung region of the connecting surfaces 29, 30 is referred to hereafter as the wringing front. In the representation of FIG. 6, the wringing front runs perpendicularly in relation to the plane of the drawing and approximately parallel to the longitudinal extents of the cooling channels 32. This applies at least in the region where the wringing front passes through the plane of the drawing. The wringing front may be formed as a straight line or slightly curved and, as the upper part 28 is increasingly brought up to the lower part 27, moves from the left to the right, i.e., the approach of the upper part 28 to the lower part 27 progresses successively from the left to the right. The progressive approach is also referred to hereafter as "rolling", and so in the representation of FIG. 6 the upper part 28 is rolled up to the lower part 27 from the left to the right. The direction of the rolling movement is illustrated in FIG. 6 by an arrow and is referred to hereafter as the rolling direction 39.

The successive wringing with a steadily migrating, linear wringing front has the effect that the gas is successively displaced out of the intermediate space between the connecting surface 30 of the upper part 28 and the connecting surface 29 of the lower part 27, and as a result the risk of gas inclusions is reduced considerably. The wringing operation is ended when the connecting surface 30 of the upper part 28 has been wrung onto the connecting surface 29 of the lower part 27 over the full surface area.

In the case of exemplary embodiments in which the connecting surface 30 of the upper part 28 and the connecting surface 29 of the lower part 27 are not formed in a rotationally symmetrical manner, the connecting surface 30 of the upper part 28 is preferably rolled up to the connecting surface 29 of the lower part 27 parallel to a direction in which the connecting surfaces 29, 30 have the smallest absolute value of the average radius of curvature.

The escape of the gas from the intermediate space between the connecting surface 30 of the upper part 28 and the connecting surface 29 of the lower part 27 can be made even easier to some extent by the connecting surface 30 of the upper part 28 and the connecting surface 29 of the lower part 27 not having exactly the same curvature.

As can be seen from FIG. 6, the rolling direction 39 runs transversely, in particular perpendicularly, to the longitudinal extent of the cooling channel openings 33 and the cooling channels 32. Since the thickness of the upper part 28 is reduced considerably in the region of the cooling channels 32, these regions act in a way similar to joints and make it easier for the upper part 28 to bend in these regions. This has the consequence that only a comparatively small force is required to keep the upper part 28 outside the contact surface 38 temporarily at a sufficiently great distance from the lower part 27 to prevent wringing from occurring there and to make the connecting surface 30 of the upper part 28 continuously approach the connecting surface 29 of the lower part 27. Furthermore, in the region of the contact surface 38, better engagement of the connecting surface 30 of the upper part 28 in close contact with the connecting surface 29 of the lower part 27 is achieved and very reliable wringing is made possible as a result.

It is similarly also possible to bring the upper part 28 up to the lower part 27 such that the rolling direction 39 runs parallel to the longitudinal extent of the cooling channel openings 33 and the cooling channel 32. In the case of this embodiment, particularly reliable venting of the intermediate space between the upper part 28 and the lower part 27 is ensured because the gas can escape along the cooling channel openings 33. The deformability in the rolling direction is reduced to some extent in comparison with the embodiment described above.

The wringing of the upper part onto the lower part in step S2 has the effect of producing an intermediate product including the lower part 27 and the upper part 28, which are rigidly connected to one another in the region of their connecting surfaces 29, 30. The intermediate product has to meet various quality requirements and only when it satisfies these quality requirements is it passed on to the heat treatment described in more detail below. Otherwise, the intermediate product is re-worked or rejected. The quality requirements relate to, for example, the occurrence of inclusions between the connecting surfaces 29 and 30.

In a step S3, which follows step S2, the intermediate product is stored for a storage time at a storage temperature. The storage time may be, for example, 24 hours. The storage temperature lies above room temperature and may be, for example, between 80° C. and 400° C. or preferably 160° C. and 400° C. In particular, the storage temperature may be between 250° C. and 350° C. Heating ramps are also possible in combination with storage at a constant storage temperature. The storage at elevated temperature has the effect that excess moisture diffuses out from the region of the connecting surfaces 29, 30, in particular via the cooling channel openings 33. Depending on the pre-treatment of the lower part 27 and the upper part 28 before the wringing and the time period between production and further use of the intermediate product, there may also be no need for step S3, in particular when there are small clear distances between adjacent cooling channels 32.

Step S3 is followed by a step S4, in which a heat treatment for the forming of a very durable connection between the lower part 27 and the upper part 28 is started. The formation of the connection by the heat treatment is also referred to hereafter as bonding. In step S4, the intermediate product is brought into a bonding oven, which guarantees, for example, a temperature homogeneity of better than 2 K. An atmosphere of air or an inert gas may be provided in the bonding oven. It is similarly also possible to evacuate the bonding oven and to carry out the heat treatment under vacuum conditions. In the bonding oven, the intermediate product is heated up at a heating rate to a holding temperature. The heating rate has values below 150 K/h, preferably below 100 K/h. The holding temperature lies in the range from 400° C. to 900° C., temperatures above 500° C., particularly above 600° C. and more particularly above 700° C. being preferred.

This is next followed by a step S5, according to which the intermediate product is kept at the holding temperature for a holding time. The holding time may be at least 8 hours, in particular at least 12 hours, or at least 20 hours.

Step S5 is followed by a step S6, in which the intermediate product is cooled, and so its temperature is reduced from the holding temperature The cooling may take place in a number of stages, the temperature of the intermediate product being reduced at different cooling rates. For example, the reduction of the temperature of the intermediate product may first take place at a cooling rate below 100 K/h or below 50 K/h, in particular between 1 K/h and 20 K/h, until a temperature of 700° C. or 600° C. is reached. Below 700° C. or 600° C., the reduction of the temperature may take place more quickly, for example at a cooling rate below 150 K/h, in particular in the range from 5 K/h to 100 K/h or from 20 K/h to 100 K/h. When a temperature of, for example, 500° C. or 400° C. is reached, the limitation of the cooling rate may be abandoned completely, and the cooling can then take place at any cooling rate until room temperature is reached. The cooling may be, for example, provided in each case by the temperature of the gas that surrounds the intermediate product and/or the temperature of the surrounding area being lowered to a value below the temperature of the intermediate product. Step S6 completes the flow diagram.

When setting the parameters of the heat treatment, in particular the holding temperature and the cooling rates, it should be noted that the settings can have an influence on the zero crossing temperature and the increase in the coefficient of thermal expansion of the mirror 26 produced with them. Although these material properties are generally already set to desired values during the production of the material used for the lower part 27 and the upper part 28, they can be changed again by the heat treatment. If, therefore, a low tolerance with respect to the zero crossing temperature and the increase in the coefficient of thermal expansion of the mirror 26 is required, it is not enough just to use a material that meets these requirements for production. It may be necessary for the heat treatment of the intermediate product to be precisely planned, while allowing for potential influencing of the parameters mentioned. When doing so, it should be noted that the influence of the heat treatment on the zero crossing temperature and the increase in the coefficient of thermal expansion depends on the material composition of the intermediate product, in particular on its OH and titanium content. To achieve low tolerances, the OH and titanium content should therefore be taken into account. If this is not known with sufficient accuracy, it may be provided within the method according to the disclosed techniques to carry out measurements for determining the OH content and/or the titanium content. Furthermore, measurements for determining the actual zero crossing temperature and the actual increase in the coefficient of thermal expansion of the intermediate product may be carried out before the heat treatment. Since some of these measurements are destructive, they are not carried out on the intermediate product itself, but on an accompanying test piece, i.e., on a piece of the material from which the intermediate product has been produced. The accompanying test piece is subjected to the same heat treatment as the intermediate product and, if the lower part 27 and the upper part 28 already undergo a heat treatment before the formation of the intermediate product, this is also carried out on the accompanying test piece. If the lower part 27 and the upper part 28 have been produced from different blanks, an accompanying test piece may be respectively provided for the lower part 27 and for the upper part 28.

Then a heat treatment profile, i.e., an intended variation over time of the temperature of the intermediate product, is individually determined from the known or measured material properties for each intermediate product or for each group of intermediate products with very similar material properties. Particularly important here is the cooling profile, and in particular the cooling rates used.

In this way, a mirror 26 of which the average zero crossing temperature has a deviation of less than or equal to +/−1 K from a desired zero crossing temperature can be produced. Deviations of less than or equal to +/−0.5 K or even less than or equal to +/−0.2 K are also possible. These values relate in each case to a zero crossing temperature that is averaged over a volume zone of the mirror 26 that overlaps laterally with the optical surface 31 and extends in depth from the optical surface 31 to 1 cm. It is similarly also possible that this volume zone extends in depth from the optical surface 31 to the cooling channels 32 or to 1 cm below the cooling channels 32. In the representation of FIG. 3, an extent to the cooling channels 32 means an extent to the upper edges of the cooling channels 32 and an extent to 1 cm below the cooling channels 32 means an extent to 1 cm below the lower edges of the cooling channels 32. In this volume zone, the predefined value may in each case decrease with increasing distance from the optical surface 31.

A further difficulty in the heat treatment is that of ensuring that the entire volume of the intermediate product is treated according to the intended heat treatment profile. For example, the peripheral regions of the intermediate product react more quickly to cooling acting from the outside, and accordingly cool down more quickly than the core regions. This problem is alleviated somewhat to the extent that it is not necessary to achieve approximately the same temperatures in the entire volume of the intermediate product at every point in time of the cooling. It is true that the predefined cooling profile, i.e., the time-dependent decrease in temperature, should be maintained as exactly as possible at each location of the intermediate product. However, a time difference between the individual locations is permissible. Accordingly, the cooling is controlled such that the cooling profiles are in each case locally maintained and for this purpose the cooling rates are adapted step by step during the cooling, if appropriate a number of times and over a number of hours, in order to achieve this objective. The adaptations may, for example, extend over a time of one to six hours.

In particular, it should be ensured that a sliding average value of the cooling rate, formed over a temperature interval of 20 K, has an identical relative variation over time in a temperature range from 900° C. to 700° C., except for a deviation of less than or equal to 2 K/h, in the entire volume of the intermediate product. This means that the cooling should take place such that, after allowing for a respective potentially existing time difference, the variations over time of this sliding average value at all locations of the intermediate product differ by less than or equal to 2 K/h. Preferably, the deviation of the sliding average value in the temperature range from 900° C. to 700° C. is less than or equal to 1 K/h. Furthermore, it may be provided that the deviation of the sliding average value in the temperature range from 700° C. to 500° C. is less than or equal to 4 K/h, preferably less than or equal to 2 K/h. With these measures it should ultimately be achieved that an inhomogeneity of the zero crossing temperature, attributable to the heat treatment within a volume zone of the mirror 26 that overlaps laterally with the optical surface 31 and extends in depth from the optical surface 31 to 1 cm, is less than or equal to +/−1 K, and preferably less than or equal to +/−0.5 K. It is similarly also possible that this volume zone extends to the cooling channels 32 or to 1 cm below the cooling channels 32.

The heat treatment is intended to achieve a tensile strength of the connection of the lower part 27 and the upper part 28 of 50 MPa or more.

In a modification, the lower part 27 and the upper part 28 are pressed against one another during the heat treatment.

The bonding process described above is in the same way also possible without wringing. The procedure is, in that case, analogously identical with the individual steps being carried out, not with the intermediate product, but with the lower part 27 and the upper part 28, which are not connected to one another by wringing.

Following the bonding process, the upper part 28 may be worked away to a thickness of 2 to 10 mm above the cooling channels 32.

After the working step of the thickness reduction of the upper part 28, or instead of this working step, the upper part 28 is re-worked such that on its side which is facing away from the connecting surface 30, and on which the optical surface 31 is to be formed, it has a predefined form with high precision and satisfies predefined roughness criteria. Then, the optical surface 31 is formed there. This may take place by, for example, applying an aluminum layer or alternately applying layers of molybdenum and silicon.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

REFERENCE NUMBERS

1 Projection exposure apparatus
2 Illumination system
3 Radiation source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
24 Cooling device
25 Control device
26 Mirror
27 Lower part
28 Upper part
29 Connecting surface
30 Connecting surface
31 Optical surface
32 Cooling channel
33 Cooling channel opening
34 Distributor channels
35 Collector channels
36 Fluid distributor
37 Fluid collector
38 Contact surface
39 Rolling direction
M Mirror
M1 Mirror
M2 Mirror
M3 Mirror
M4 Mirror
M5 Mirror
M6 Mirror

What is claimed is:

1. A method for producing a mirror of a microlithographic projection exposure apparatus, comprising:
   providing a first mirror part and a second mirror part such that the first mirror part and the second mirror part are in contact in a region of a first connecting surface of the first mirror part and a second connecting surface of the second mirror part,
   forming a durable connection between the first mirror part and the second mirror part by heating the first mirror part and the second mirror part to a holding temperature of at least 400° C. and less than or equal to 900° C. and holding the first mirror part and second mirror part at the holding temperature during a holding time, and
   after the holding time has elapsed, cooling the first mirror part and the second mirror part to a first cooling temperature at a first cooling rate of less than or equal to 100 K/h.

2. The method as claimed in claim 1, wherein providing the first mirror part and the second mirror part comprises providing the first mirror part and the second mirror part as an intermediate product that is produced by wringing the first connecting surface of the first mirror part and the second connecting surface of the second mirror part.

3. The method of claim 2, further comprising storing the intermediate product at a storage temperature greater than or equal to 80° C. and less than or equal to 400° C. for at least 2 hours before heating the first mirror part and the second mirror part to the holding temperature.

4. The method of claim 1, wherein heating the first mirror part and the second mirror part to the holding temperature comprises heating the first mirror part and the second mirror part at a heating rate of less than or equal to 150 K/h.

5. The method of claim 1, wherein the holding time is at least 8 hours.

6. The method of claim 1, wherein the first cooling temperature is less than or equal to 700° C.

7. The method of claim 1, further comprising, after the cooling to the first cooling temperature, cooling the first mirror part and the second mirror part to a second cooling temperature that is less than the first cooling temperature at a second cooling rate that is greater than the first cooling rate.

8. The method of claim 7, wherein cooling the first mirror part and the second mirror part to the first cooling temperature and the second cooling temperature comprises cooling the first mirror part and the second mirror part such that a sliding average value of the cooling rate, formed over a temperature interval of 20 K, has an identical relative variation over time in a temperature range from 900° C. to 700° C., except for a deviation of less than or equal to 2 K/h, in an entire volume of the first mirror part and/or the second mirror part.

9. The method of claim 7, wherein the first cooling rate and/or the second cooling rate is chosen dependent on a material composition of the first mirror part and/or the second mirror part.

10. The method of claim 7, wherein the first cooling rate and/or the second cooling rate is chosen dependent on a desired average zero crossing temperature of the mirror.

11. The method of claim 7, further comprising determining the first cooling rate and/or the second cooling rate by analyzing a material sample of a material from which the first mirror part and/or the second mirror part has been produced.

12. A mirror of a microlithographic projection exposure apparatus comprising:
    a first mirror part;
    a second mirror part;
    an optical surface configured to reflect light;
    wherein:
        the first mirror part and the second mirror part are durably connected to one another in a region of a first connecting surface of the first mirror part and a second connecting surface of the second mirror part by a heat treatment; and
        the mirror has, within a volume zone that overlaps laterally with the optical surface and extends in depth from the optical surface to 1 cm, an average zero crossing temperature that deviates from a predefined value by less than or equal to +/−1 K and wherein the predefined value decreases with increasing distance from the optical surface.

13. An illumination optical unit comprising the mirror of claim 12.

14. A microlithographic projection exposure apparatus comprising an illumination optical unit as claimed in claim 13.

15. A projection optical unit comprising the mirror of claim 12.

16. A microlithographic projection exposure apparatus comprising a projection optical unit as claimed in claim 15.

17. A method for producing a mirror of a microlithographic projection exposure apparatus, comprising:
    providing a first mirror part and a second mirror part such that the first mirror part and the second mirror part are in contact in a region of a first connecting surface of the first mirror part and a second connecting surface of the second mirror part,
    forming a durable connection between the first mirror part and the second mirror part by heating the first mirror part and the second mirror part to a holding temperature of at least 400° C. and holding the first mirror part and second mirror part at the holding temperature during a holding time,
    after the holding time has elapsed, cooling the first mirror part and the second mirror part to a first cooling temperature at a first cooling rate of less than or equal to 100 K/h; and
    after the cooling to the first cooling temperature, cooling the first mirror part and the second mirror part to a second cooling temperature that is less than the first cooling temperature at a second cooling rate that is greater than the first cooling rate,
    wherein cooling the first mirror part and the second mirror part to the first cooling temperature and the second cooling temperature comprises cooling the first mirror part and the second mirror part such that a sliding average value of the cooling rate, formed over a temperature interval of 20 K, has an identical relative variation over time in a temperature range from 900° C. to 700° C., except for a deviation of less than or equal to 2 K/h, in an entire volume of the first mirror part and/or the second mirror part.

* * * * *

UNITED STATES PATENT AND TRADEMARK OFFICE
CERTIFICATE OF CORRECTION

PATENT NO. : 12,117,731 B2
APPLICATION NO. : 18/080109
DATED : October 15, 2024
INVENTOR(S) : Zaczek et al.

Page 1 of 1

It is certified that error appears in the above-identified patent and that said Letters Patent is hereby corrected as shown below:

In the Specification

Column 12, Line 46, delete "ß" and insert -- β --.

Column 12, Line 48, delete "ß" and insert -- β --.

Column 14, Line 50, delete "adopted:" and insert -- adopted. --.

Column 20, Line 12, delete "applicable" and insert -- applicable. --.

Column 20, Line 59, delete "edges" and insert -- edges. --.

Column 21, Line 59, delete "material" and insert -- material. --.

Column 25, Line 22, delete "temperature" and insert -- temperature. --.

Signed and Sealed this
Thirteenth Day of May, 2025

Coke Morgan Stewart
*Acting Director of the United States Patent and Trademark Office*